(12) United States Patent
Tajima et al.

(10) Patent No.: US 11,699,724 B2
(45) Date of Patent: Jul. 11, 2023

(54) SEMICONDUCTOR DEVICE

(71) Applicant: KABUSHIKI KAISHA TOSHIBA, Tokyo (JP)

(72) Inventors: Jumpei Tajima, Mitaka (JP); Toshiki Hikosaka, Kawasaki (JP); Shinya Nunoue, Ichikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/984,797

(22) Filed: Nov. 10, 2022

(65) Prior Publication Data

US 2023/0071966 A1    Mar. 9, 2023

Related U.S. Application Data

(62) Division of application No. 17/141,269, filed on Jan. 5, 2021, now Pat. No. 11,538,909.

(30) Foreign Application Priority Data

Apr. 6, 2020    (JP) .................... 2020-068619

(51) Int. Cl.
*H01L 29/20*    (2006.01)
*H01L 29/36*    (2006.01)

(52) U.S. Cl.
CPC .......... *H01L 29/2003* (2013.01); *H01L 29/36* (2013.01)

(58) Field of Classification Search
None
See application file for complete search history.

(56) References Cited

U.S. PATENT DOCUMENTS

| 8,860,089 | B2 | 10/2014 | Park et al. |
| 11,538,909 | B2 * | 12/2022 | Tajima ................ H01L 29/2003 |
| 2001/0020700 | A1 | 9/2001 | Inoue et al. |
| 2009/0134456 | A1 | 5/2009 | Sugimoto et al. |
| 2010/0127275 | A1 | 5/2010 | Takehiko et al. |

(Continued)

FOREIGN PATENT DOCUMENTS

| JP | 2001-196575 A | 7/2001 |
| JP | 2007-5764 A | 1/2007 |
| JP | 2008-21756 A | 1/2008 |

(Continued)

*Primary Examiner* — Jack S Chen
(74) *Attorney, Agent, or Firm* — Oblon, McClelland, Maier & Neustadt, L.L.P.

(57) ABSTRACT

According to one embodiment, a semiconductor device includes a first crystal region, a second crystal region, a third crystal region, and a fourth crystal region. The first crystal region includes magnesium and $Al_{x1}Ga_{1-x1}N$ ($0 \le x1 < 1$). The second crystal region includes $Al_{x2}Ga_{1-x2}N$ ($0 < x2 \le 1$). The third crystal region is provided between the first crystal region and the second crystal region. The third crystal region includes oxygen and $Al_{x3}Ga_{1-x3}N$ ($0 \le x3 \le 1$ and $x3 < x2$). The fourth crystal region is provided between the third crystal region and the second crystal region. The fourth crystal region includes $Al_{x4}Ga_{1-x4}N$ ($0 \le x4 < 1$ and $x4 < x2$).

17 Claims, 8 Drawing Sheets

(56) References Cited

U.S. PATENT DOCUMENTS

2016/0260827 A1  9/2016  Nishimori et al.
2021/0313432 A1  10/2021  Tajima

FOREIGN PATENT DOCUMENTS

| JP | 2010-153837 A | 7/2010 |
| JP | 2011-155221 A | 8/2011 |
| JP | 2013-125913 A | 6/2013 |
| JP | 2016-163017 A | 9/2016 |
| WO | WO 2020/004021 A1 | 1/2020 |

* cited by examiner

SEMICONDUCTOR DEVICE

CROSS-REFERENCE TO RELATED APPLICATIONS

This application is a divisional of and claims benefit under 35 U.S.C. § 120 to U.S. application Ser. No. 17/141,269 filed on Jan. 5, 2021, which is based upon and claims the benefit of priority under 35 U.S.C. § 119 to Japanese Patent Application No. 2020-068619, filed on Apr. 6, 2020, the entire contents of each of which are incorporated herein by reference.

FIELD

Embodiments described herein generally relate to a semiconductor device.

BACKGROUND

For example, it is desirable to improve the characteristics of a semiconductor device such as a transistor or the like.

DETAILED DESCRIPTION

Figure 1:
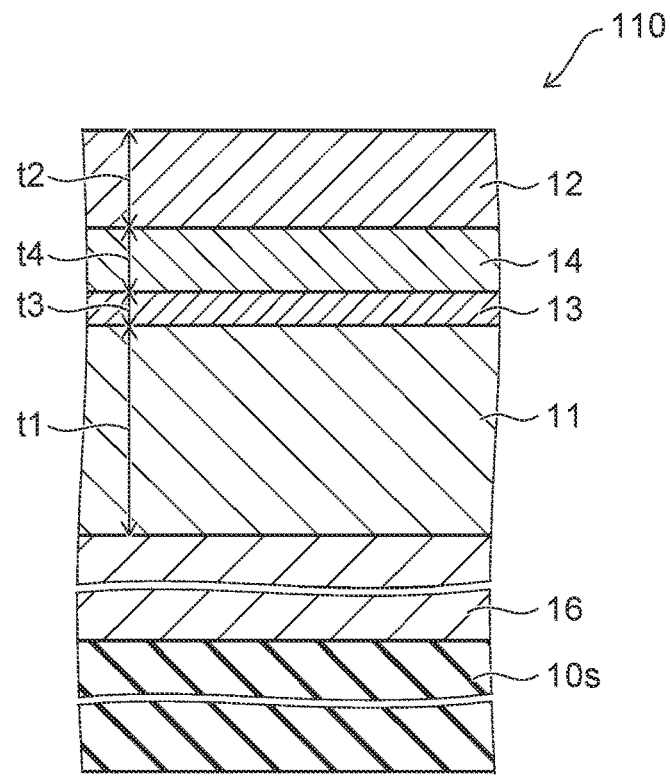
FIG. 1 is a schematic cross-sectional view illustrating a semiconductor device according to a first embodiment.

According to one embodiment, a semiconductor device includes a first cr region, a second crystal region, a third crystal region, and a fourth crystal region. The first crystal region includes magnesium and $Al_{x1}Ga_{1-x1}N$ ($0 \leq x1 < 1$). The second crystal region includes $Al_{x2}Ga_{1-x2}N$ ($0 < x2 \leq 1$). The third crystal region is provided between the first crystal region and the second crystal region. The third crystal region includes oxygen and $Al_{x3}Ga_{1-x3}N$ ($0 \leq x3 \leq 1$ and $x3 < x2$). The fourth crystal region is provided between the third crystal region and the second crystal region. The fourth crystal region includes $Al_{x4}Ga_{1-x4}N$ ($0 \leq x4 < 1$ and $x4 < x2$).

According to one embodiment, a semiconductor device includes a first crystal region, a second crystal region, a third crystal region, and a fourth crystal region. The first crystal region includes magnesium and $Al_{x1}Ga_{1-x1}N$ ($0 \leq x1 < 1$). The second crystal region includes $Al_{x2}Ga_{1-x2}N$ ($0 < x2 \leq 1$ and $x1 < x2$). The third crystal region is provided between the first crystal region and the second crystal region. The third crystal region includes silicon and $Al_{x3}Ga_{1-x3}N$ ($0 \leq x3 \leq 1$). The fourth crystal region is provided between the third crystal region and the second crystal region. The fourth crystal region includes $Al_{x4}Ga_{1-x4}N$ ($0 \leq x4 < 1$ and $x4 < x2$). The third crystal region includes silicon. The first crystal region does not include silicon, or a concentration of silicon in the first crystal region is less than a concentration of silicon in the third crystal region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first crystal region 11, a second crystal region 12, a third crystal region 13, and a fourth crystal region 14.

The first crystal region 11 includes magnesium (Mg) and $Al_{x1}Ga_{1-x1}N$ ($0 \leq x1 < 1$). The composition ratio x1 is, for example, not less than 0 and not more than 0.5. In one example, the composition ratio x1 is, for example, not less than 0 but less than 0.2. The first crystal region 11 is, for example, a GaN layer.

The second crystal region 12 includes $Al_{x2}Ga_{1-x2}N$ ($0 < x2 \leq 1$). The composition ratio x2 is, for example, not less than 0.1 and not more than 0.5. In one example, the composition ratio x2 is, for example, not less than 0.2 and not more than 0.5. For example, the composition ratio x2 is greater than the composition ratio x1. In another example, the composition ratio x2 is, for example, not less than 0.1 and not more than 0.2. The second crystal region 12 is, for example, an AlGaN layer.

The third crystal region 13 is located between the first crystal region 11 and the second crystal region 12. The third crystal region 13 includes oxygen and $Al_{x3}Ga_{1-x3}N$ ($0 \leq x3 \leq 1$ and $x3 < x2$). The composition ratio x3 is, for example, not less than 0 and not more than 0.5. In one example, the composition ratio x3 is, for example, not less than 0 but less than 0.2. In another example, the composition ratio x3 is, for example, not less than 0 but less than 0.1. The third crystal region 13 is, for example, a GaN layer that includes oxygen. The third crystal region 13 maintains the crystal structure of the nitride semiconductor while including oxygen. In one example of the third crystal region 13, the oxygen may be at lattice points of the crystal structure. In another example of the third crystal region 13, the oxygen may be at a position different from lattice points of the crystal structure. The concentration (e.g., the peak concentration) of oxygen in the third crystal region 13 is, for example, not less than $2 \times 10^{17}$ $cm^{-3}$ and not more than $1 \times 10^{20}$ $cm^{-3}$.

The fourth crystal region 14 is located between the third crystal region 13 and the second crystal region 12. The fourth crystal region 14 includes $Al_{x4}Ga_{1-x4}N$ ($0 \leq x4 < 1$ and $x4 < x2$). The fourth crystal region 14 is, for example, a GaN layer. In one example, the composition ratio x4 is, for example, not less than 0 but less than 0.2. In another example, the composition ratio x4 is, for example, not less than 0 but less than 0.1.

As shown in FIG. 1, the semiconductor device 110 may include a substrate 10s and a sixth crystal region 16. For example, the sixth crystal region 16 includes a nitride semiconductor that includes Al. The sixth crystal region 16 is, for example, a buffer layer. The sixth crystal region 16 is between the substrate 10s and the first crystal region 11. For example, the sixth crystal region 16 is provided on the substrate 10s. The first crystal region 11 is provided on the sixth crystal region 16. The third crystal region 13 is provided on the first crystal region 11. The fourth crystal region 14 is provided on the third crystal region 13. The second crystal region 12 is provided on the fourth crystal region 14.

The direction from the first crystal region 11 toward the fourth crystal region 14 is taken as a Z-axis direction. One direction perpendicular to the Z-axis direction is taken as an X-axis direction. A direction perpendicular to the Z-axis direction and the X-axis direction is taken as a Y-axis direction. The Z-axis direction corresponds to the stacking direction of the first to fourth crystal regions 11 to 14. The first to fourth crystal regions 11 to 14 spread along the X-Y plane.

In one example as described below, the semiconductor device 110 is, for example, at least a portion of a transistor. For example, a carrier layer (e.g., a two-dimensional electron gas) is formed at the vicinity of the interface between the second crystal region 12 of the fourth crystal region 14. In the semiconductor device 110, the threshold voltage can be increased by providing the first crystal region 11 including Mg. It was found that by providing the third crystal region 13, for example, the Mg concentration in the fourth crystal region 14 can be reduced. By reducing the Mg concentration in the fourth crystal region 14, for example, a high mobility can be maintained. For example, a low on-resistance is obtained. For example, a high threshold and a low on-resistance are obtained. According to the embodiment, a semiconductor device can be provided in which the characteristics can be improved.

For example, the sixth crystal region 16, the first crystal region 11, and the third crystal region 13 are formed by crystal growth in this order on the substrate 10s. The fourth crystal region 14 and the second crystal region 12 are formed by crystal growth in this order on the third crystal region 13. It is considered that the third crystal region 13 suppresses the movement of the Mg included in the first crystal region 11 toward the fourth crystal region 14.

In the embodiment, for example, the fourth crystal region 14 does not include Mg. Or, a fourth concentration of Mg in the fourth crystal region 14 is less than a first concentration of Mg in the first crystal region 11. For example, the fourth concentration is not more than 1/5 of the first concentration.

An example of profiles of the concentrations of Mg, etc., of the semiconductor device 110 will now be described.

Figure 2:
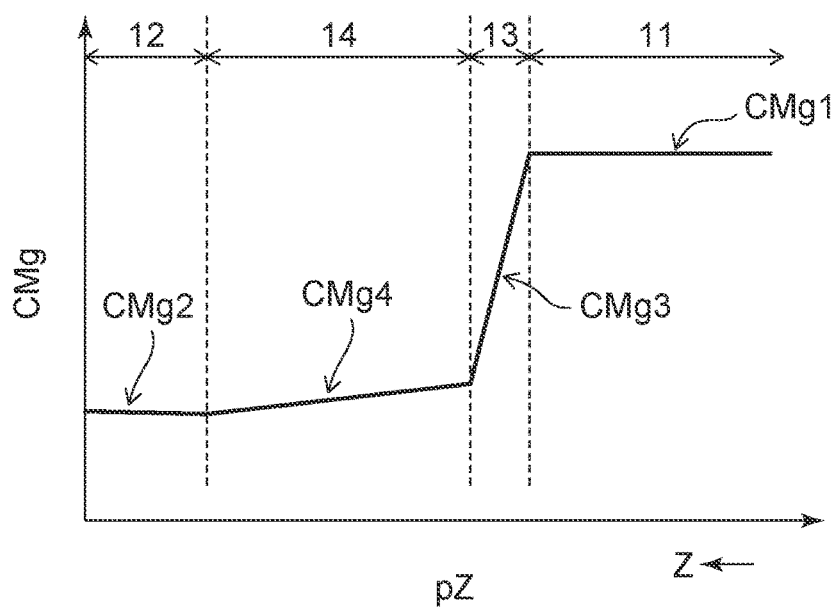
FIG. 2 is a graph illustrating the semiconductor device according to the first embodiment.

FIG. 2 is a graph illustrating the semiconductor device according to the first embodiment.

The horizontal axis of FIG. 2 is a position pZ along the Z-axis direction. The vertical axis of FIG. 2 is a logarithm CMg of the Mg concentration. FIG. 2 shows a logarithm CMg1 of the first concentration of Mg in the first crystal region 11, a logarithm CMg2 of a second concentration of Mg in the second crystal region 12, a logarithm CMg3 of a third concentration of Mg in the third crystal region 13, and a logarithm CMg4 of the fourth concentration of Mg in the fourth crystal region 14.

As shown in FIG. 2, the fourth concentration (the logarithm CMg4) of Mg in the fourth crystal region 14 is less than the first concentration (the logarithm CMg1) of Mg in the first crystal region 11. The third concentration (the logarithm CMg3) of Mg in the third crystal region 13 decreases along a first orientation (the +Z orientation) from the first crystal region 11 toward the fourth crystal region 14. A third change rate of the logarithm CMg3 of the third concentration with respect to the change of the position pZ along the first orientation is greater than a fourth change rate of the logarithm CMg4 of the fourth concentration with respect to the change of the position pZ along the first orientation. The concentration of Mg abruptly decreases in the third crystal region 13.

The embodiment includes the third crystal region 13 in which the Mg concentration abruptly changes, and the fourth crystal region 14 in which the change rate of the Mg concentration is small (or does not change). For example, a two-dimensional electron gas is formed in the fourth crystal region 14 at the vicinity of the second crystal region 12. When the Mg concentration in the fourth crystal region 14 is high, the movement of the electrons is impeded by the Mg. By setting the Mg concentration in the fourth crystal region 14 to be low, the impedance of the movement of the electrons by the Mg is suppressed. By setting the Mg concentration in the fourth crystal region 14 to be low, high electron mobility is easily obtained.

By setting the Mg concentration in the first crystal region 11 to be high, the threshold voltage can be effectively increased. The concentration of Mg abruptly decreases in the third crystal region 13.

It is considered that the movement of Mg in the third crystal region 13 is suppressed by, for example, a strong bond between Mg and oxygen. For example, it is considered that in the growth of the third crystal region 13, the Mg diffuses upward due to the oxygen included in the first crystal region 11 being replaced with Ga of the surface of the third crystal region 13. Because the third crystal region 13 includes oxygen, the oxygen and the Mg bond at this time. It is considered that the upward diffusion of the Mg is suppressed thereby.

As shown in FIG. 2, the second concentration (the logarithm CMg2) of Mg in the second crystal region 12 is less than the first concentration (the logarithm CMg1). For example, the second concentration (the logarithm CMg2) is less than the fourth concentration (the logarithm CMg4).

Figure 3A:
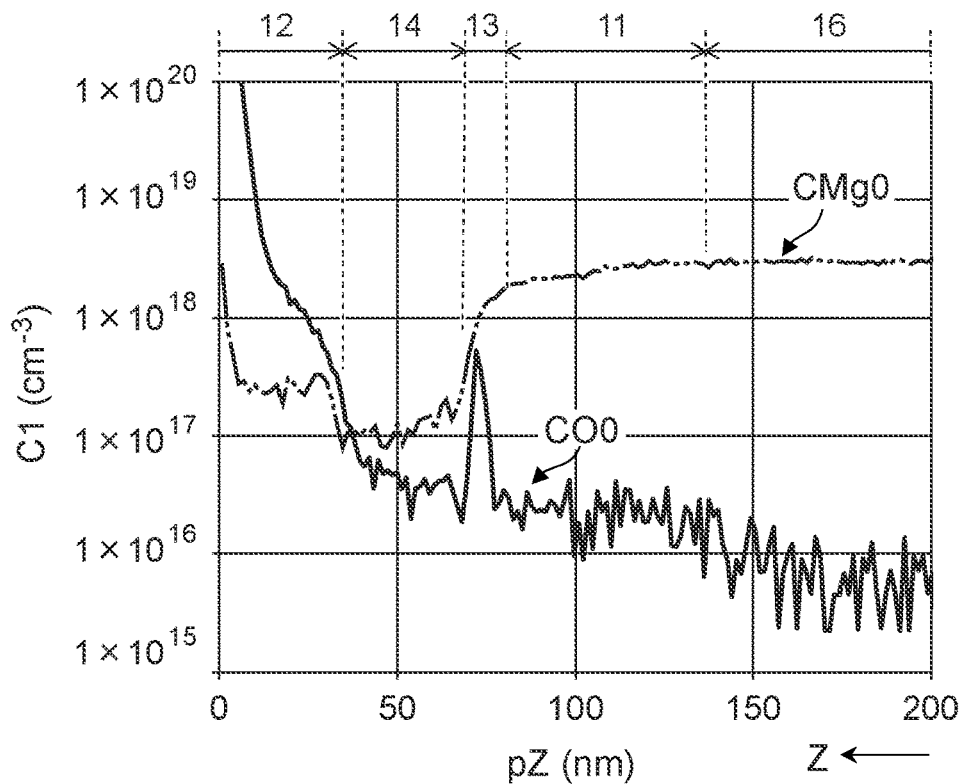
FIGS. 3A and 3B are graphs illustrating characteristics of the semiconductor device.
Figure 3B:
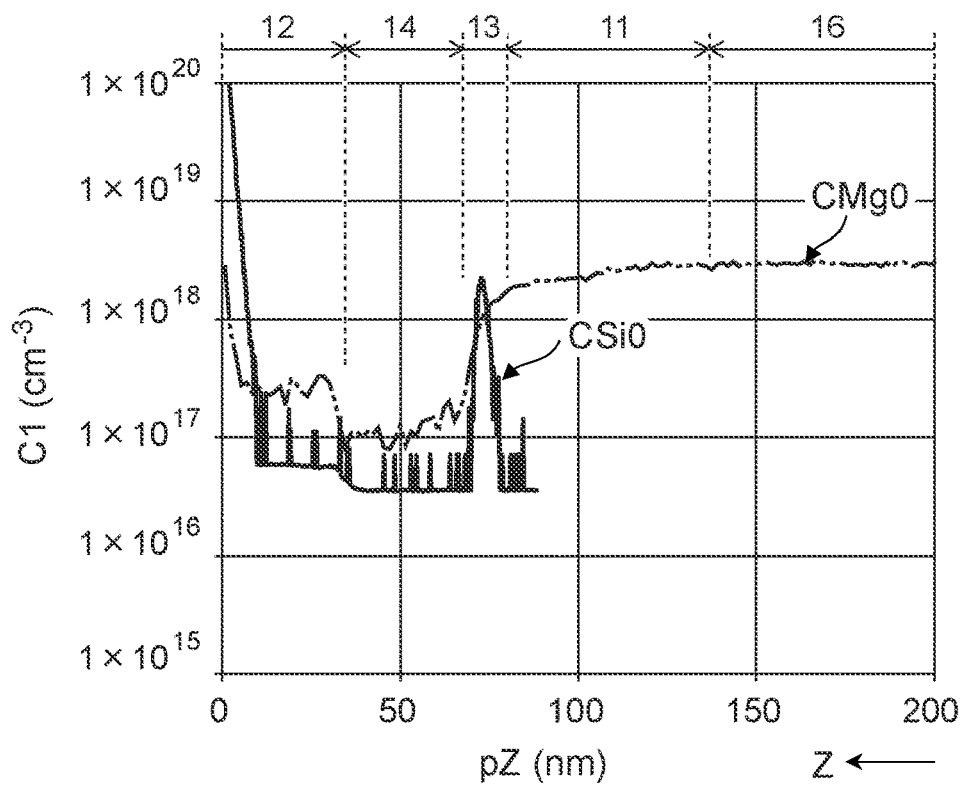
Figure 4:
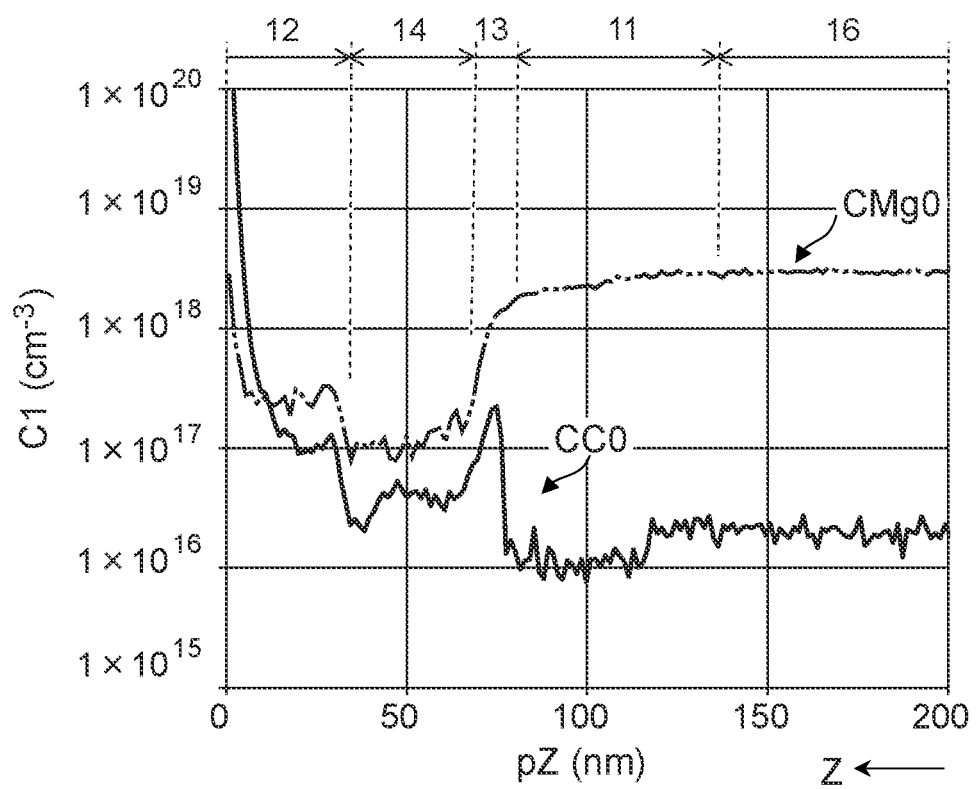
FIG. 4 is a graph illustrating characteristics of the semiconductor device.

FIGS. 3A, 3B, and 4 are graphs illustrating characteristics of the semiconductor device.

These figures illustrate SIMS (Secondary Ion Mass Spectrometry) analysis results of a sample according to the embodiment. In this sample, the sixth crystal region 16 and a first layer, which is used to form the first crystal region 11, are formed by crystal growth in this order on the substrate 10s. Subsequently, a second layer that includes oxygen is formed on the first layer that is used to form the first crystal region 11, and the second layer is subsequently removed. In the example, the second layer includes Si in addition to oxygen. At least a portion of the oxygen and the silicon included in the second layer is introduced to the first layer. The region of the first layer into which the oxygen (and the silicon) are introduced is used to form the third crystal region 13. The region of the first layer into which oxygen (and silicon) are substantially not introduced is used to form the first crystal region 11. The third crystal region 13 that stably includes oxygen (and silicon) can be stably formed by such a method. The sample is made by forming the fourth crystal region 14 and the second crystal region 12 on the third crystal region 13.

FIG. 3A shows a concentration CMg0 of Mg and a concentration CO0 of oxygen of the sample. FIG. 3B shows the concentration CMg0 of Mg and a concentration CSi0 of silicon (Si). The horizontal axis is the position pZ in the Z-axis direction. The vertical axis is a concentration C1.

As shown in FIGS. 3A and 3B, the concentration CMg0 of Mg decreases in a step configuration in the third crystal region 13. The concentration CMg0 of Mg is low in the fourth crystal region 14. As shown in FIG. 3A, the concentration CO0 of oxygen is locally high in the third crystal region 13. By providing the third crystal region 13 that has the locally-high concentration of Mg, the concentration CMg0 of Mg in the third crystal region 13 is caused to decrease in the step configuration.

As shown in FIG. 3B, the concentration CSi0 of Si may be locally high in the third crystal region 13. For example, there are cases where oxygen functions as a donor in a nitride semiconductor. By providing the third crystal region 13 that has the locally-high concentration of Si, the oxygen that is included in the third crystal region 13 is deactivated. For example, bond between silicon and oxygen exist in the third crystal region 13. The unfavorable effects of oxygen in the third crystal region 13 can be suppressed thereby.

Thus, the third crystal region 13 may include silicon. The first crystal region 11 does not include silicon. Or, the silicon concentration in the first crystal region 11 is less than the silicon concentration in the third crystal region 13. For example, the fourth crystal region 14 does not include silicon. Or, the silicon concentration in the fourth crystal region 14 is less than the silicon concentration in the third crystal region 13.

For example, the concentration (e.g., the peak concentration) of silicon in the third crystal region 13 is not less than $2\times10^{17}$ cm$^{-3}$ and not more than $5\times10^{19}$ cm$^{-3}$.

FIG. 4 shows the concentration CMg0 of Mg and a concentration CC0 of carbon of the sample. The horizontal axis is the position pZ in the Z-axis direction. The vertical axis is the concentration C1. As shown in FIG. 4, the concentration CC0 of carbon is locally high in the third crystal region 13. It is considered that the carbon originates in an organic metal, which is a source gas, etc. For example, carbon has a function of compensating residual donors. By compensating the residual donors, unfavorable effects of oxygen and/or silicon can be suppressed.

Thus, the third crystal region 13 may include carbon. The first crystal region 11 does not include carbon. Or, the carbon concentration in the first crystal region 11 is less than the carbon concentration in the third crystal region 13. For example, the fourth crystal region 14 does not include carbon. Or, the carbon concentration in the fourth crystal region 14 is less than the carbon concentration in the third crystal region 13.

For example, the concentration (e.g., the peak concentration) of carbon in the third crystal region 13 is not less than $1\times10^{17}$ cm$^{-3}$ and not more than $1\times10^{20}$ cm$^{-3}$.

In the embodiment, for example, at least a portion of the crystal of the third crystal region 13 is continuous with the crystal of the first crystal region 11. For example, the third crystal region 13 is an epitaxial layer that is provided on the fourth crystal region 14. For example, at least a portion of the crystal of the third crystal region 13 is continuous with the crystal of the fourth crystal region 14. For example, the fourth crystal region 14 is an epitaxial layer that is provided on the third crystal region 13. By providing a crystal region in which the crystal is continuous, for example, high crystal quality is obtained. For example, high mobility is obtained.

An example of characteristics of the semiconductor device 110 (e.g., the transistor) will now be described.

Figure 5:
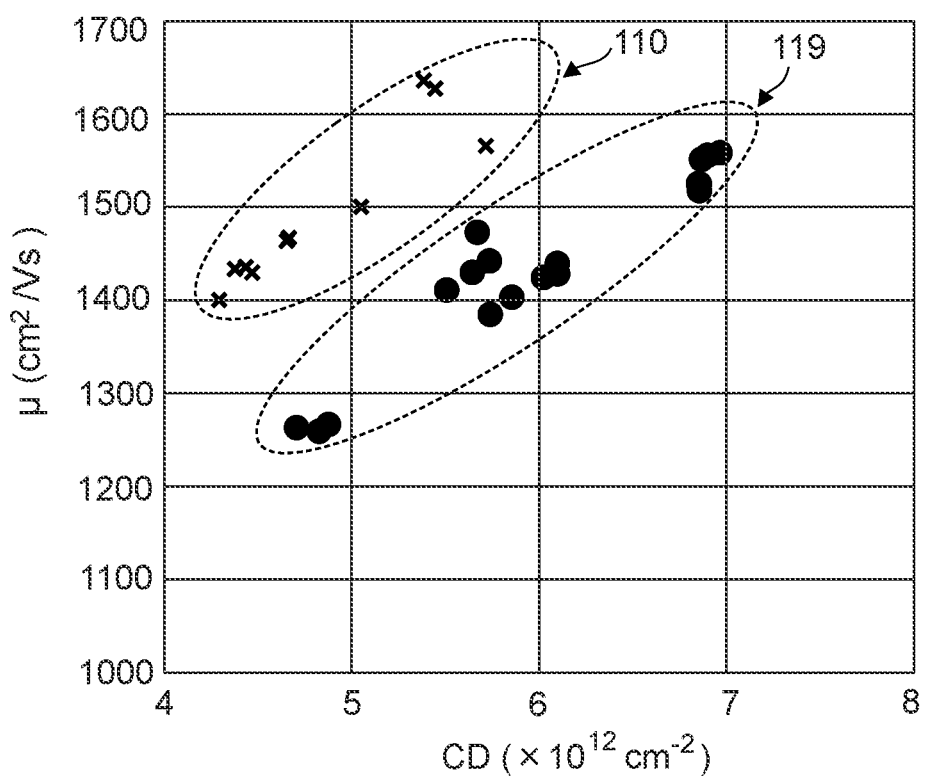
FIG. 5 is a graph illustrating characteristics of semiconductor devices.

FIG. 5 is a graph illustrating characteristics of semiconductor devices.

FIG. 5 shows measurement results of characteristics of a semiconductor device 119 of a reference example in addition to measurement results of the characteristics of the semiconductor device 110 according to the embodiment. The third crystal region 13 is not provided in the semiconductor device 119. The first crystal region 11 and the fourth crystal region 14 contact each other in the semiconductor device 119. Otherwise, the configuration of the semiconductor device 119 is similar to the configuration of the semiconductor device 110. In the semiconductor device 119, the fourth crystal region 14 and the second crystal region 12 are continuously formed after forming the first layer that is used to form the first crystal region 11. In the semiconductor device 119, the Mg concentration in the second crystal region 12 is not less than about $2\times10^{18}$ cm$^{-3}$ and not more than about $6\times10^{18}$ cm$^{-3}$, and the Mg concentration in the fourth crystal region 14 is not less than about $1\times10^{18}$ cm$^{-3}$ and not more than about $5\times10^{18}$ cm$^{-3}$. The semiconductor devices 110 and 119 are transistors.

The horizontal axis of FIG. 5 is a carrier density CD. The vertical axis is a carrier mobility $\mu$. When comparing the same carrier density CD as shown in FIG. 5, the mobility of the semiconductor device 110 is greater than that of the semiconductor device 119. It is considered that this is caused by the low Mg concentration in the second and fourth crystal regions 12 and 14 of the semiconductor device 110. According to the embodiment, a high carrier mobility $\mu$ is obtained. A low on-resistance is obtained thereby.

Thus, according to the embodiment, a high threshold is obtained by providing the first crystal region 11 that includes Mg. By providing the third crystal region 13, the Mg concentration in the second and fourth crystal regions 12 and 14 can be low. For example, a low on-resistance is obtained.

In the embodiment, it is favorable for a thickness t3 of the third crystal region 13 (referring to FIG. 1) to be, for example, not less than 2 nm and not more than 20 nm. The third crystal region 13 is, for example, a delta-doped layer of oxygen (and silicon). The thickness t3 may be not less than 2 nm and not more than 10 nm. By setting the thickness t3 to be not less than 2 nm, for example, the diffusion (or the movement) of Mg is easily suppressed. By setting the thickness t3 to be not more than 20 nm, for example, a high threshold voltage is easily obtained. By setting the thickness t3 to be not more than 10 nm, for example, an even higher threshold voltage is easily obtained.

It is favorable for a thickness t4 of the fourth crystal region 14 (referring to FIG. 1) to be, for example, not less than 10 nm and not more than 200 nm. By setting the thickness t4 to be not less than 10 nm, for example, the threshold voltage is stably and easily controlled. By setting the thickness t4 to be not more than 100 nm, for example, a high threshold voltage is easily obtained.

It is favorable for a thickness t1 of the first crystal region 11 (referring to FIG. 1) to be, for example, not less than 200 nm and not more than 1000 nm. By setting the thickness t1 to be not less than 200 nm, for example, a high threshold voltage is easily obtained. By setting the thickness t1 to be not more than 1000 nm, for example, the residual Mg at the interior wall of the crystal growth processing chamber or the like is easily suppressed. The incorporation of Mg from the vapor phase can be suppressed thereby.

It is favorable for a thickness t2 of the second crystal region 12 (referring to FIG. 1) to be, for example, not less than 1 nm and not more than 50 nm. By setting the thickness t2 to be not less than 1 nm, for example, high electron mobility is stably and easily obtained, By setting the thickness t1 to be not more than 50 nm, for example, good MIS structure gate characteristics are easily obtained. By setting the thickness t2 to be not more than 10 nm, for example, a high threshold voltage is easily obtained. The thickness t1, the thickness t2, the thickness t3, and the thickness t4 are, for example, lengths along the Z-axis direction.

Figure 6:
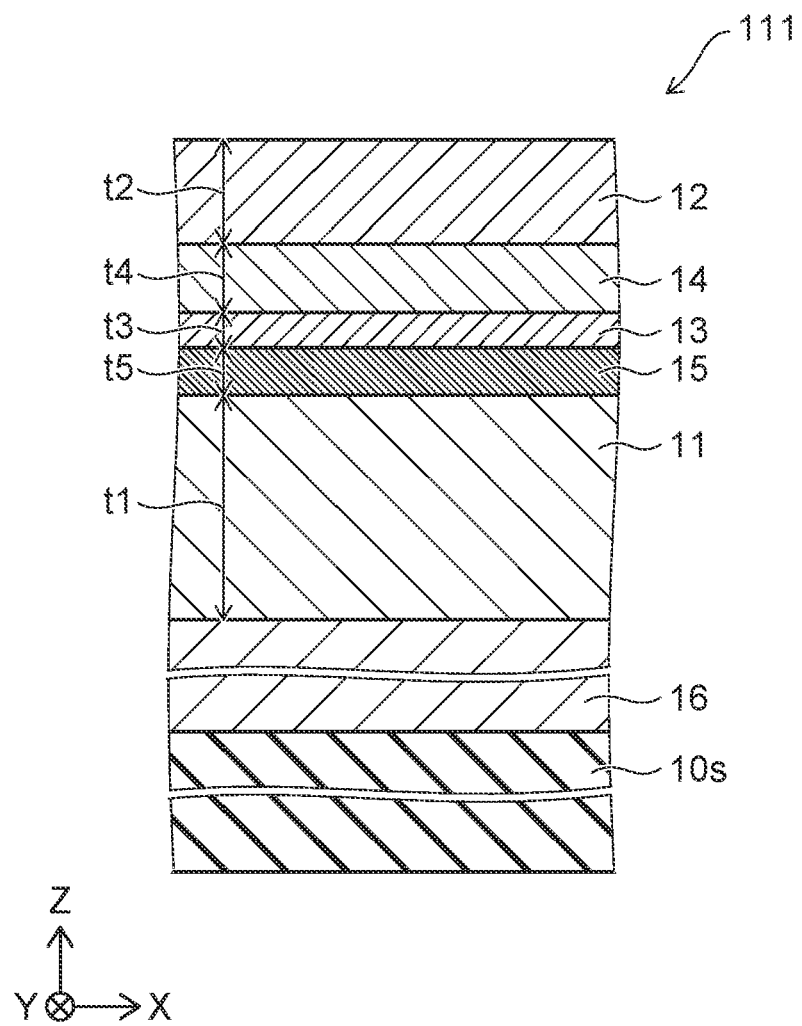
FIG. 6 is a schematic cross-sectional view illustrating a semiconductor device according to the first embodiment.

FIG. 6 is a schematic cross-sectional view illustrating a semiconductor device according to the first embodiment.

As shown in FIG. 6, the semiconductor device 111 according to the embodiment includes a fifth crystal region 15 in addition to the first, second, third, and fourth crystal regions 11, 12, 13, and 14. Otherwise, the configuration of the semiconductor device 111 may be similar to the configuration of the semiconductor device 110. An example of the fifth crystal region 15 will now be described.

As shown in FIG. 6, the fifth crystal region 15 is provided between the first crystal region 11 and the third crystal region 13. The fifth crystal region 15 includes $Al_{x5}Ga_{1-x5}N$ (0<x5≤1, x1<x5, and x3<x5). The composition ratio x5 is, for example, not less than 0.1 and not more than 0.5. In one example, the composition ratio x5 is, for example, not less than 0.2 and not more than 0.5. The fifth crystal region 15 is, for example, an AlGaN layer.

The surface of the AlGaN layer easily oxidizes. The surface of the AlGaN layer easily incorporates oxygen. For example, the region of the AlGaN layer that incorporates oxygen may correspond to at least a portion of the third crystal region 13. For example, the region of the AlGaN layer into which oxygen is substantially not incorporated may correspond to the fifth crystal region 15. In the third crystal region 13, the composition ratio of Al may change along the Z-axis direction. By providing the fifth crystal region 15, a region that locally includes oxygen is stably and easily obtained.

For example, at least a portion of the crystal of the third crystal region 13 is continuous with the crystal of the fifth crystal region 15. For example, at least a portion of the crystal of the fifth crystal region 15 is continuous with the crystal of the first crystal region 11.

Second Embodiment

Figure 7:
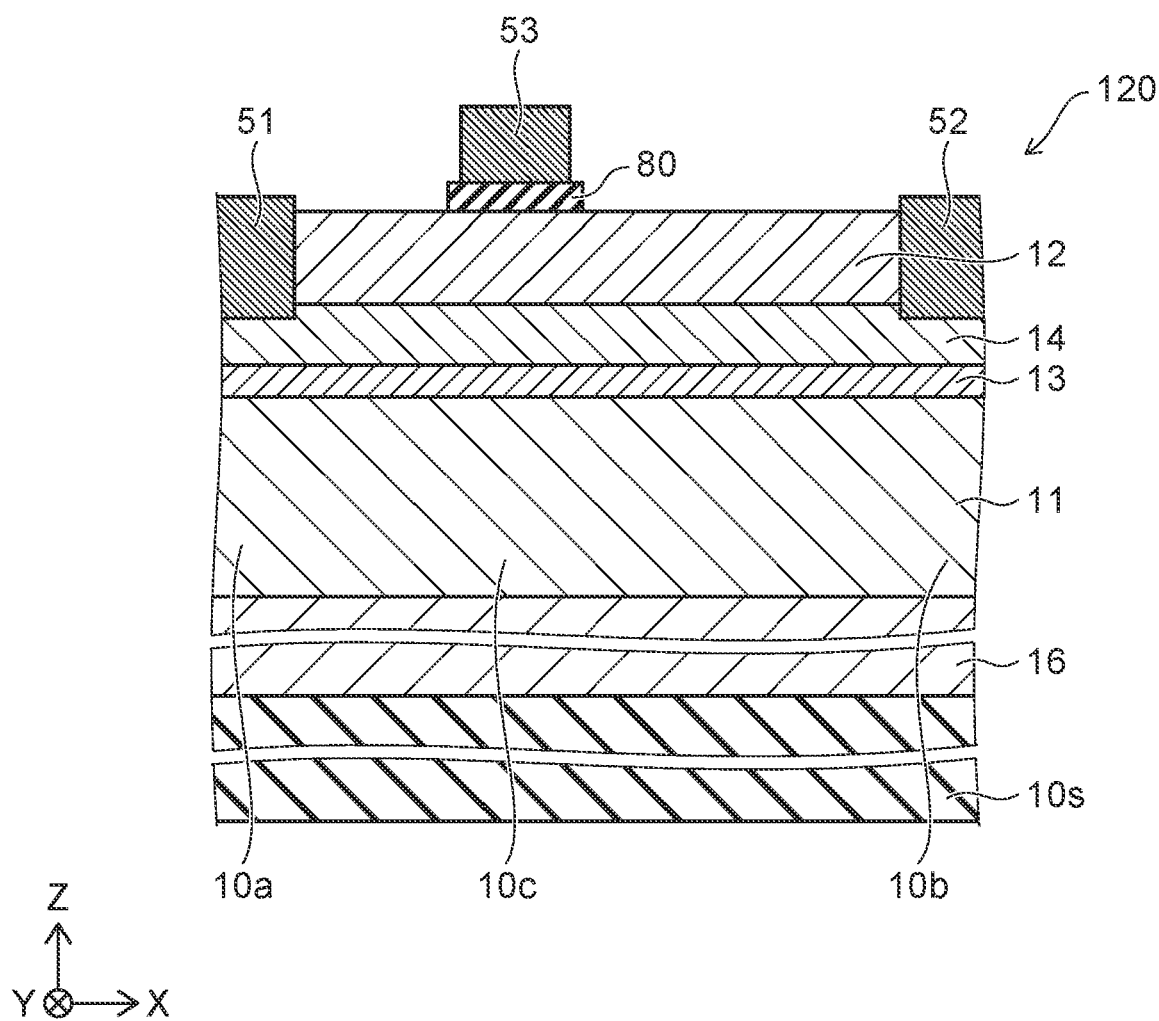
FIG. 7 is a schematic cross-sectional view illustrating a semiconductor device according to a second embodiment.

FIG. 7 is a schematic cross-sectional view illustrating a semiconductor device according to a second embodiment.

As shown in FIG. 7, the semiconductor device 120 according to the embodiment includes a first electrode 51, a second electrode 52, and a third electrode 53 in addition to the substrate 10s, the first crystal region 11, the third crystal region 13, the fourth crystal region 14, and the second crystal region 12. In the example, the semiconductor device 120 includes the sixth crystal region 16. The configurations of the first, third, fourth, and second crystal regions 11, 13, 14, and 12 of the semiconductor device 120 may be the same respectively as the configurations of the semiconductor device 110. The fifth crystal region 15 may be provided in the semiconductor device 120. An example of the electrodes will now be described.

As shown in FIG. 7, the direction from a portion 10a of the first crystal region 11 toward the first electrode 51 is along the first direction (e.g., the Z-axis direction) from the first crystal region 11 toward the second crystal region 12. The direction from another portion 10b of the first crystal region 11 toward the second electrode 52 is along the first direction (the Z-axis direction). A second direction from the first electrode 51 toward the second electrode 52 crosses the first direction. The second direction is, for example, the X-axis direction. The position in the second direction of the third electrode 53 is between the position in the second direction of the first electrode 51 and the position in the second direction of the second electrode 52.

For example, in the example, a portion of the second crystal region 12 is between the third electrode 53 and a portion 10c of the first crystal region 11. A portion of the second crystal region 12 is between the third electrode 53 and a portion of the fourth crystal region 14. An insulating film 80 is between the second crystal region 12 and the third electrode 53.

For example, the first electrode 51 functions as a source electrode. For example, the second electrode 52 functions as a drain electrode. For example, the third electrode 53 functions as a gate electrode. The semiconductor device 120 is, for example, a HEMT (High Electron Mobility Transistor). In the semiconductor device 120, for example, normally-off characteristics are easily obtained when the composition ratio x2 is low, i.e., not less than 0.1 and not more than 0.2.

Figure 8:
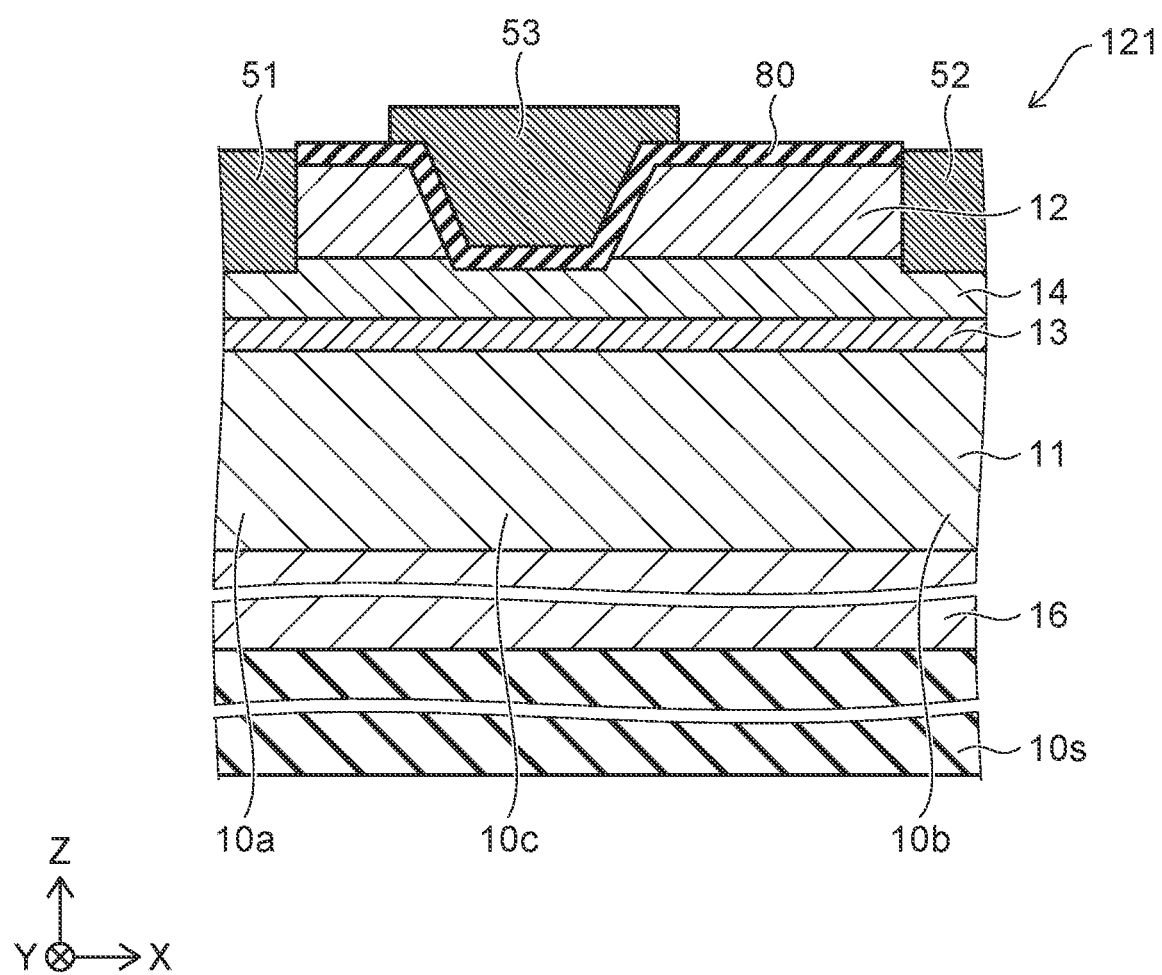
FIG. 8 is a schematic cross-sectional view illustrating a semiconductor device according to the second embodiment.
Figure 9:
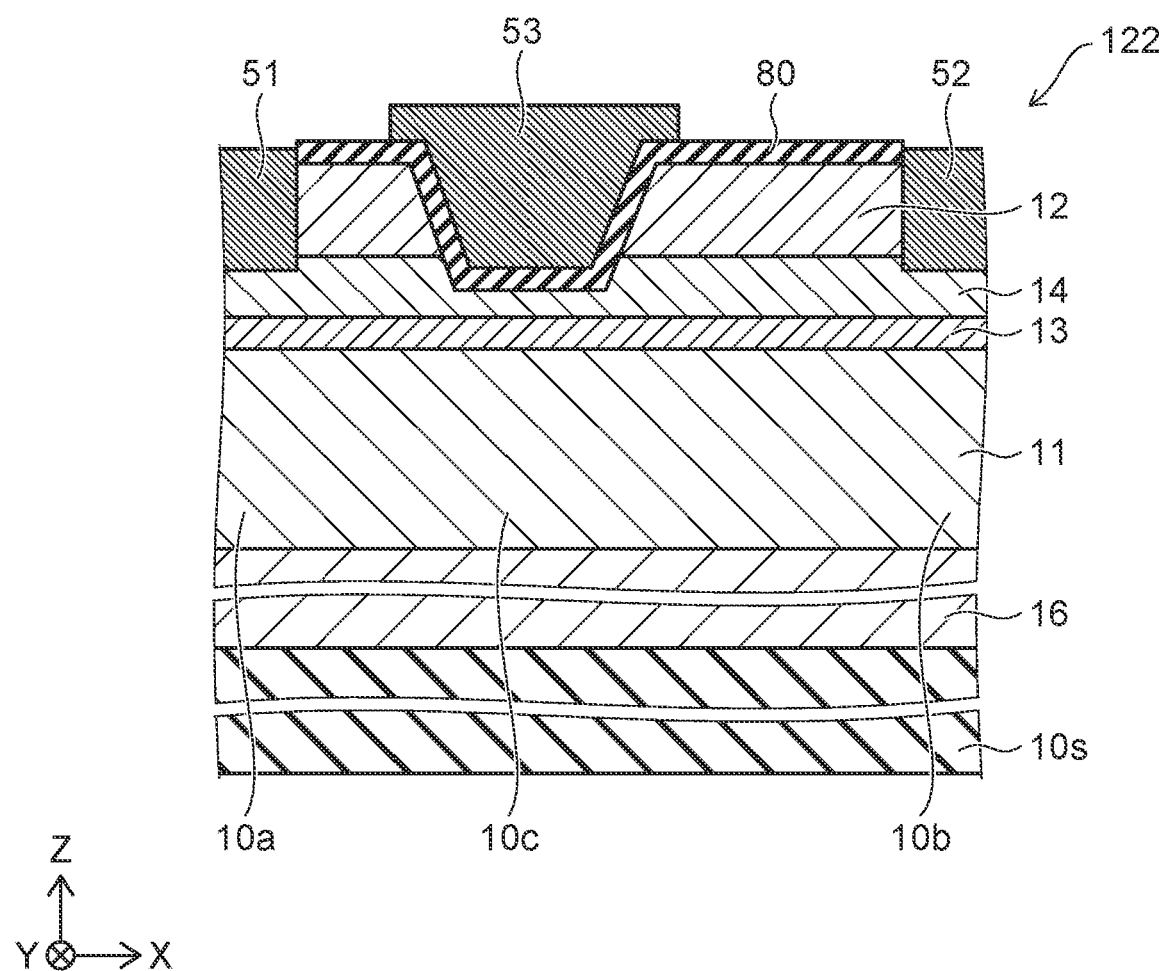
FIG. 9 is a schematic cross-sectional view illustrating a semiconductor device according to the second embodiment.

FIGS. 8 and 9 are schematic cross-sectional views illustrating semiconductor devices according to the second embodiment.

As shown in FIGS. 8 and 9, the semiconductor devices 121 and 122 according to the embodiment also include the substrate 10s, the first crystal region 11, the third crystal region 13, the fourth crystal region 14, the second crystal region 12, the first electrode 51, the second electrode 52, the third electrode 53, and the insulating film 80.

In the semiconductor devices 121 and 122, the direction from at least a portion of the third electrode 53 toward the second crystal region 12 is along the X-axis direction. The semiconductor devices 121 and 122 include, for example, recessed gate electrodes. In the semiconductor device 121, the direction from at least a portion of the third electrode 53 toward a portion of the second crystal region 12 is along the X-axis direction. In the semiconductor device 122, the direction from at least a portion of the third electrode 53 toward a portion of the fourth crystal region 14 is along the X-axis direction.

The first crystal region 11 described above is grown using a gas that includes a raw material including gallium, ammonia, and a raw material including magnesium.

As described above, the third crystal region 13 can be formed by exposing the first layer that is used to form the first crystal region 11 to a material (an atmosphere) including oxygen. Or, at least a portion of the formation of the third crystal region 13 may be performed using a gas that includes oxygen, ammonia, and a raw material including gallium.

The fourth crystal region 14 described above is grown using a gas including a raw material that includes ammonia and a raw material including gallium. The second crystal region 12 described above is grown using a gas that includes a raw material including gallium and aluminum and a raw material including ammonia.

In the embodiment, the substrate 10s includes, for example, silicon. The substrate 10s may include, for example, sapphire, SiC, or GaN. The sixth crystal region 16 includes, for example, AlN. The sixth crystal region 16 may include, for example, a stacked body in which multiple AlGaN layers are stacked. The sixth crystal region 16 may include, for example, a superlattice structure in which a GaN layer and an AlN layer are periodically stacked.

According to the embodiments, a semiconductor device can be provided in which the characteristics can be improved.

In the embodiments, "nitride semiconductor" includes all compositions of semiconductors of the chemical formula $B_xIn_yAl_zGa_{1-x-y-z}N$ ($0 \le x \le 1$, $0 \le y \le 1$, $0 \le z \le 1$, and $x+y+z \le 1$) for which the composition ratios x, y, and z are changed within the ranges respectively, "Nitride semiconductor" further includes Group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as substrates, crystal regions, electrodes, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first crystal region including magnesium and $Al_{x1}Ga_{1-x1}N$ ($0 \le x1 < 1$);
a second crystal region including $Al_{x2}Ga_{1-x2}N$ ($0 < x2 \le 1$ and $x1 < x2$);
a third crystal region provided between the first crystal region and the second crystal region, the third crystal region including silicon and $Al_{x3}Ga_{1-x3}N$ ($0 \le x3 \le 1$); and
a fourth crystal region provided between the third crystal region and the second crystal region, the fourth crystal region including $Al_{x4}Ga_{1-x4}N$ ($0 \le x4 < 1$ and $x4 < x2$),
the third crystal region including silicon,
the first crystal region not including silicon, or a concentration of silicon in the first crystal region being less than a concentration of silicon in the third crystal region.

2. The device according to claim 1, wherein
the concentration of silicon in the third crystal region is not less than $2 \times 10^{17}$ $cm^{-3}$ and not more than $5 \times 10^{19}$ $cm^{-3}$.

3. The device according to claim 1, wherein
a concentration of oxygen in the third crystal region is not less than $2 \times 10^{17}$ $cm^{-3}$ and not more than $1 \times 10^{20}$ $cm^{-3}$.

4. The device according to claim 1, wherein
the fourth crystal region does not include silicon, or a concentration of silicon in the fourth crystal region is less than the concentration of silicon in the third crystal region.

5. The device according to claim 1, wherein
at least a portion of a crystal of the third crystal region is continuous with a crystal of the fourth crystal region.

6. The device according to claim 1, wherein
at least a portion of a crystal of the third crystal region is continuous with a crystal of the first crystal region.

7. The device according to claim 1, further comprising:
a fifth crystal region provided between the first crystal region and the third crystal region, the fifth crystal region including $Al_{x5}Ga_{1-x5}N$ ($0 < x5 \le 1$, $x1 < x5$, and $x3 < x5$).

8. The device according to claim 7, wherein
at least a portion of a crystal of the third crystal region is continuous with a crystal of the fifth crystal region.

9. The device according to claim 8, wherein
the at least a portion of the crystal of the fifth crystal region is continuous with a crystal of the first crystal region.

10. The device according to claim 1, wherein
a thickness of the third crystal region is not less than 2 nm and not more than 20 nm.

11. The device according to claim 1, wherein
a thickness of the third crystal region is not less than 2 nm and not more than 10 nm.

12. The device according to claim 1, wherein
the fourth crystal region does not include magnesium, or a fourth concentration of magnesium in the fourth crystal region is less than a first concentration of magnesium in the first crystal region.

13. The device according to claim 12, wherein
the fourth concentration is not more than ⅕ of the first concentration.

14. The device according to claim 12, wherein
a third concentration of magnesium in the third crystal region decreases along a first orientation,
the first orientation is from the first crystal region toward the fourth crystal region, and
a third change rate of a logarithm of the third concentration with respect to a change of a position along the first orientation is greater than a fourth change rate of a logarithm of the fourth concentration with respect to a change of a position along the first orientation.

15. The device according to claim 1, wherein
a thickness of the fourth crystal region is not less than 10 nm and not more than 200 nm.

16. The device according to claim 1, further comprising:
a substrate; and
a sixth crystal region including a nitride semiconductor including Al,
the sixth crystal region being between the substrate and the first crystal region.

17. The device according to claim 1, further comprising:
a first electrode;
a second electrode; and
a third electrode, a direction from a portion of the first crystal region toward the first electrode being along a first direction from the first crystal region toward the second crystal region, a direction from an other portion of the first crystal region toward the second electrode being along the first direction, a second direction from the first electrode toward the second electrode crossing the first direction, a position in the second direction of the third electrode being between a position in the second direction of the first electrode and a position in the second direction of the second electrode.

\* \* \* \* \*